United States Patent
Taniguchi

(10) Patent No.: US 10,727,806 B2
(45) Date of Patent: Jul. 28, 2020

(54) BALUN

(71) Applicant: Murata Manufacturing Co., Ltd., Nagaokakyo-shi, Kyoto-fu (JP)

(72) Inventor: Tetsuo Taniguchi, Nagaokakyo (JP)

(73) Assignee: Murata Manufacturing Co., Ltd., Kyoto (KR)

( * ) Notice: Subject to any disclaimer, the term of this patent is extended or adjusted under 35 U.S.C. 154(b) by 0 days.

(21) Appl. No.: 16/551,774

(22) Filed: Aug. 27, 2019

(65) Prior Publication Data

US 2019/0386629 A1  Dec. 19, 2019

Related U.S. Application Data

(63) Continuation of application No. PCT/JP2018/002146, filed on Jan. 24, 2018.

(30) Foreign Application Priority Data

Mar. 15, 2017  (JP) ................... 2017-049765

(51) Int. Cl.
 *H03H 7/42* (2006.01)
 *H03H 7/01* (2006.01)

(52) U.S. Cl.
 CPC ............ *H03H 7/42* (2013.01); *H03H 7/0115* (2013.01)

(58) Field of Classification Search
 CPC combination set(s) only.
 See application file for complete search history.

(56) References Cited

U.S. PATENT DOCUMENTS

| 7,961,063 B2* | 6/2011 | Liu ........................ H03H 7/42 333/26 |
| 8,005,206 B1* | 8/2011 | Doose ................. H04M 11/062 379/413.02 |
| 8,896,394 B2 | 11/2014 | Taniguchi |
| 10,601,390 B2* | 3/2020 | Taniguchi ............ H03H 7/0123 |
| 2017/0170800 A1 | 6/2017 | Saito |

FOREIGN PATENT DOCUMENTS

| JP | 09-50918 A | 2/1997 |
| JP | 2012-205195 A | 10/2012 |
| JP | 2016-086327 A | 5/2016 |
| WO | 2012/127952 A1 | 9/2012 |

OTHER PUBLICATIONS

Official Communication issued in International Patent Application No. PCT/JP2018/002146, dated Apr. 3, 2018.

* cited by examiner

*Primary Examiner* — An T Luu
(74) *Attorney, Agent, or Firm* — Keating & Bennett, LLP

(57) ABSTRACT

A balun includes a first LC resonator, a second LC resonator, a third LC resonator, and a fourth LC resonator. The second LC resonator is magnetically coupled with the first LC resonator. The fourth LC resonator is magnetically coupled with the third LC resonator and electrically connected between a third terminal and a fourth terminal in parallel with the second LC resonator. Each of the first LC resonator and the second LC resonator has a resonant frequency that is a first resonant frequency. Each of the third LC resonator and the fourth LC resonator has a resonant frequency that is a second resonant frequency higher than the first resonant frequency.

17 Claims, 5 Drawing Sheets

BALUN

CROSS REFERENCE TO RELATED APPLICATIONS

This application claims the benefit of priority to Japanese Patent Application No. 2017-049765 filed on Mar. 15, 2017 and is a Continuation Application of PCT Application No. PCT/JP2018/002146 filed on Jan. 24, 2018. The entire contents of each application are hereby incorporated herein by reference.

BACKGROUND OF THE INVENTION

1. Field of the Invention

The present invention relates to a balun that converts between a balanced signal and an unbalanced signal.

2. Description of the Related Art

A balun that converts between balanced signals and unbalanced signals of a certain frequency band (single band) has been known. Balanced signals refer to any two signals that are 180-degrees out of phase with each other, with their maximum amplitude values being substantially equal. Unbalanced signals refer to signals having amplitudes relative to the ground potential.

For example, Japanese Unexamined Patent Application Publication No. 2012-205195 discloses a balun that converts between balanced signals and unbalanced signals in such a manner that an inductor and a capacitor are used to provide a signal with a 90-degree phase shift in one direction and another 90-degree phase shift in the opposite direction.

A balun for a plurality of frequency bands (multi-band balun) may be formed by combining single-band baluns such as the one disclosed in Japanese Unexamined Patent Application Publication No. 2012-205195 with a switch for switching among the single-band baluns for different frequency bands.

Such a single-band balun includes two terminals for balanced signals as opposed to one terminal for unbalanced signals. With the number of single-band baluns being n, these baluns require a 2n-pole double-throw (PDT) switch to define a multi-band balun for n frequency bands. This is because, according to the frequency band of a signal to be converted, two terminals for balanced signals of the multi-band balun need to be connected to two respective terminals of one of n single-band baluns that is provided for the frequency band concerned (two terminals among 2n terminals for balanced signals). Accordingly, such a multi-band balun may be large in size due to the inclusion of the switch.

SUMMARY OF THE INVENTION

Preferred embodiments of the present invention provide multi-band baluns each having a small size.

A balun according to a preferred embodiment of the present invention includes first to fourth terminals, first to fourth LC resonators, first and second inductors, and first and second capacitors. The first and second terminals are terminals for unbalanced signals. The third and fourth terminals are terminals for balanced signals. The first LC resonator is electrically connected between the first terminal and a ground point. The second LC resonator is magnetically coupled with the first LC resonator and electrically connected between the third terminal and the fourth terminal. The third LC resonator is electrically connected between the second terminal and the ground point. The fourth LC resonator is magnetically coupled with the third LC resonator and electrically connected between the third terminal and the fourth terminal in parallel with the second LC resonator. The first inductor is electrically connected between the third terminal and the second LC resonator. The second inductor is electrically connected between the fourth terminal and the second LC resonator. The first capacitor is electrically connected between the third terminal and the fourth LC resonator. The second capacitor is electrically connected between the fourth terminal and the fourth LC resonator. Each of the first LC resonator and the second LC resonator has a resonant frequency that is a first resonant frequency. Each of the third LC resonator and the fourth LC resonator has a resonant frequency that is a second resonant frequency higher than the first resonant frequency.

In the baluns according to the preferred embodiments of the present invention, the first resonant frequency of each of the first and second LC resonators magnetically coupled with each other is different from the second resonant frequency of each of the third and fourth LC resonators magnetically coupled with each other. Thus, without using a switch, the baluns is able to convert between balanced signals and unbalanced signals of the first resonant frequency and between balanced signals and unbalanced signals of the second resonant frequency. Accordingly, the multi-band balun is able to have a small size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below in detail with reference to the drawings. Note that the same reference signs refer to the same or similar elements and portions throughout and, as a rule, a redundant description thereof will be omitted.

First Preferred Embodiment

Figure 1:
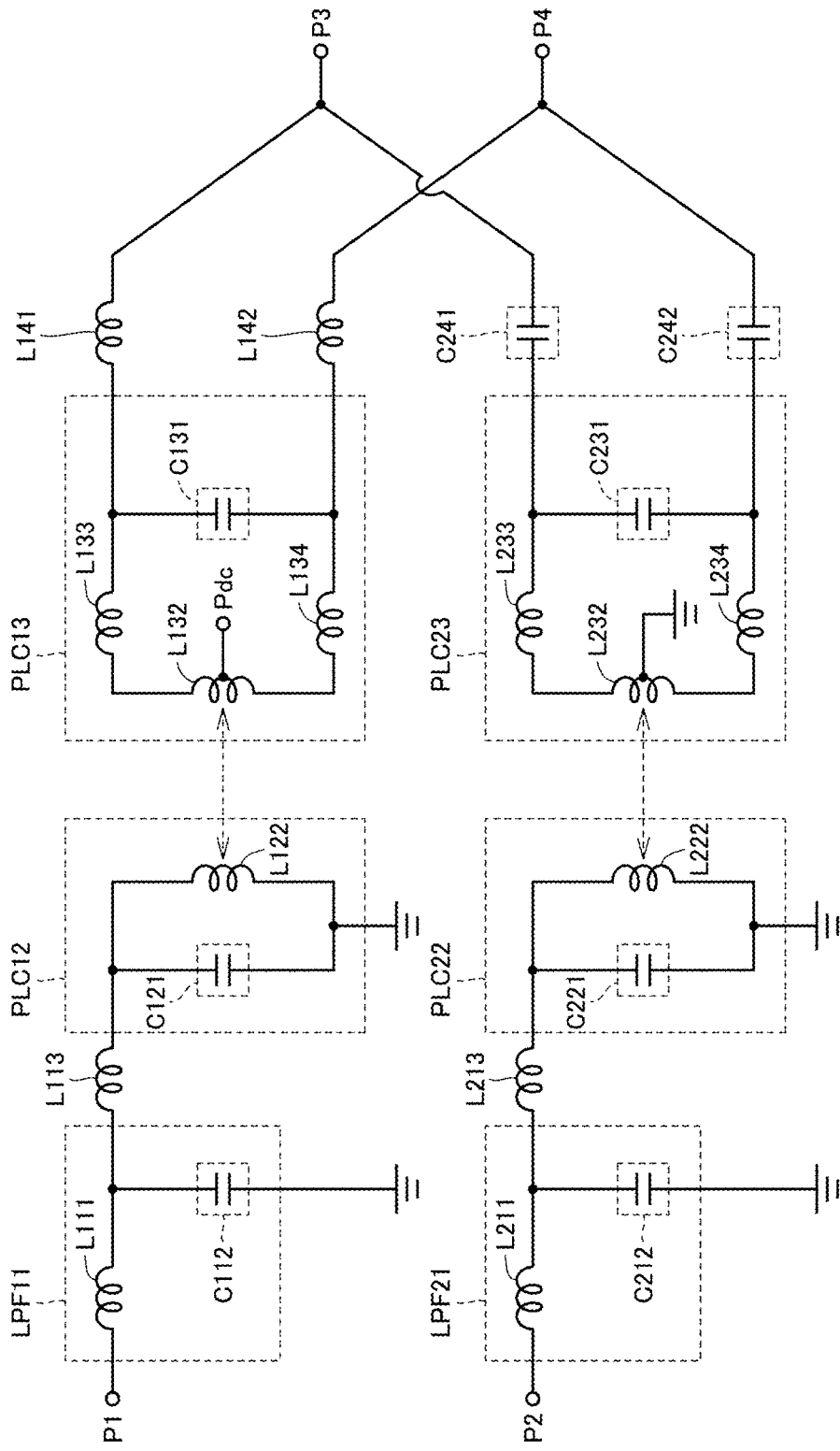
FIG. 1 is a circuit diagram of a balun according to a first preferred embodiment of the present invention.

FIG. 1 is a circuit diagram of a balun 10 according to a first preferred embodiment of the present invention. The balun converts between balanced signals and unbalanced signals of frequency f1 and between balanced signals and unbalanced signals of frequency f2 (>f1). As illustrated in FIG. 1, the balun 10 includes terminals P1 to P4, LC parallel resonators PLC12, PLC13, PLC22, and PLC23, low-pass filters LPF11 and LPF21, inductors L113 and L213, inductors L141 and L142, capacitors C241 and C242, and a DC feed terminal Pdc.

The terminals P1 and P2 are for unbalanced signals. The terminals P1 and P2 are electrically connected to corresponding antennas (not illustrated). The terminal P1 receives input of unbalanced signals of frequency f1 and outputs unbalanced signals of frequency f1. The terminal P2 receives input of unbalanced signals of frequency f2 and outputs unbalanced signals of frequency f2.

The terminals P3 and P4 are for balanced signals. The terminals P3 and P4 are electrically connected to an integrated circuit (IC) (not illustrated). A signal output from the terminal P3 and a signal output from the terminal P4 have a phase difference of 180 degrees therebetween. A signal input to the terminal P3 and a signal input to the terminal P4 have a phase difference of 180 degrees therebetween.

The LC parallel resonator PLC12 is electrically connected between the terminal P1 and the ground point. The resonant frequency of the LC parallel resonator PLC12 is the frequency f1. The LC parallel resonator PLC12 includes a capacitor C121 and an inductor L122. The capacitor C121 and the inductor L122 are electrically connected in parallel between the terminal P1 and the ground point.

The LC parallel resonator PLC13 is electrically connected between the terminals P3 and P4. The resonant frequency of the LC parallel resonator PLC13 is the frequency f1. The LC parallel resonator PLC13 includes a capacitor C131 and inductors L132 to L134. The capacitor C131 and the inductor L132 are electrically connected in parallel between the terminals P3 and P4. The inductor L132 is magnetically coupled with the inductor L122. The inductor L132 is electrically connected to the DC feed terminal Pdc. Since one end and the other end of the inductor L132 are electrically connected to the terminal P3 and the terminal P4, respectively, the direct potentials of the terminals P3 and P4 may be adjusted by varying the voltage applied to the DC feed terminal Pdc.

The inductor L133 is electrically connected between one end of the capacitor C131 and one end of the inductor L132. The inductor L134 is electrically connected between the other end of the capacitor C131 and the other end of the inductor L132. The inductance of the inductor L133 is equal or substantially equal to the inductance of the inductor L134. The inductors L133 and L134 are provided to set the impedance of the LC parallel resonator PLC13 to a preferred or predetermined value. The inductors L132 to L134 may be defined by one inductor.

The LC parallel resonator PLC22 is electrically connected between the terminal P2 and the ground point. The LC parallel resonator PLC22 includes a capacitor C221 and an inductor L222. The capacitor C221 and the inductor L222 are electrically connected in parallel between the terminal P2 and the ground point. The resonant frequency of the LC parallel resonator PLC22 is the frequency f2.

The LC parallel resonator PLC23 is electrically connected between the terminals P3 and P4 in parallel with the LC parallel resonator PLC13. The resonant frequency of the LC parallel resonator PLC 23 is the frequency f2. The LC parallel resonator PLC23 includes a capacitor C231 and inductors L232 to L234. The capacitor C231 and the inductor L232 are electrically connected in parallel between the terminals P3 and P4. The inductor L232 is magnetically coupled with the inductor L222. The inductor L232 is electrically connected to the ground point. The inductor L233 is electrically connected between one end of the capacitor C231 and one end of the inductor L232. The inductor L234 is electrically connected between the other end of the capacitor C231 and the other end of the inductor L232. The inductance of the inductor L233 is equal or substantially equal to the inductance of the inductor L234. The inductors L233 and L234 are provided to set the impedance of the LC parallel resonator PLC23 to a preferred or predetermined value. The inductors L232 to L234 may be formed as one inductor.

The inductor L113 is electrically connected between the terminal P1 and the LC parallel resonator PLC12. Together with the capacitor C121 included in the LC parallel resonator PLC12, the inductor L113 defines a low-pass filter. The low-pass filter allows signals of frequency f1 to pass therethrough and significantly reduces the harmonic waves of signals of frequency f1. A harmonic wave of a given frequency refers to a signal whose frequency is an integer multiple of the frequency concerned. The source of the harmonic waves of signals of frequency f1 is, for example, an IC (not illustrated) to which the terminals P3 and P4 are connected or an external device (not illustrated) connected to the terminal P1.

The low-pass filter LPF11 is electrically connected between the terminal P1 and the inductor L113. The low-pass filter LPF11 includes an inductor L111 and a capacitor C112. The inductor L111 is electrically connected between the terminal P1 and the inductor L113. The capacitor C112 is electrically connected between the inductor L111 and the ground point. The low-pass filter LPF11 allows signals of frequency f1 to pass therethrough and significantly reduces the harmonic waves of signals of frequency f1.

The inductor L213 is electrically connected between the terminal P2 and the LC parallel resonator PLC22. Together with the capacitor C221 included in the LC parallel resonator PLC22, the inductor L213 defines a low-pass filter. The low-pass filter allows signals of frequency f2 to pass therethrough and significantly reduces the harmonic waves of signals of frequency f2. The source of the harmonic waves of signals of frequency f2 is, for example, an IC (not illustrated) to which the terminals P3 and P4 are connected or an external device (not illustrated) connected to the terminal P2.

The low-pass filter LPF21 is electrically connected between the terminal P2 and the inductor L213. The low-pass filter LPF21 includes an inductor L211 and a capacitor C212. The inductor L211 is electrically connected between the terminal P2 and the inductor L213. The capacitor C212 is electrically connected between the inductor L211 and the ground point. The low-pass filter LPF21 allows signals of frequency f2 to pass therethrough and significantly reduces the harmonic waves of signals of frequency f2.

The inductor L141 is electrically connected between the terminal P3 and the LC parallel resonator PLC13. The inductor L141 allows signals of frequency f1 to pass therethrough and significantly reduces signals of frequencies higher than the frequency f1 (e.g., signals of frequency f2). In place of the inductor L141, a low-pass filter may be included.

The inductor L142 is electrically connected between the terminal P4 and the LC parallel resonator PLC13. The inductance of the inductor L142 is equal or substantially equal to the inductance of the inductor L141. The inductor L142 allows signals of frequency f1 to pass therethrough and significantly reduces signals of frequencies higher than the frequency f1 (e.g., signals of frequency f2). In place of the inductor L142, a low-pass filter may be included.

The capacitor C241 is electrically connected between the terminal P3 and the LC parallel resonator PLC23. The capacitor C241 allows signals of frequency f2 to pass therethrough and significantly reduces signals of frequencies lower than the frequency f2 (e.g., signals of frequency f1). In place of the capacitor C241, a high-pass filter may be included.

The capacitor C242 is electrically connected between the terminal P4 and the LC parallel resonator PLC23. The capacitance of the capacitor C242 is equal or substantially equal to the capacitance of the capacitor C241. The capacitor C242 allows signals of frequency f2 to pass therethrough and significantly reduces signals of frequencies lower than the frequency f2 (e.g., signals of frequency f1). In place of the capacitor C242, a high-pass filter may be included.

Figure 2:
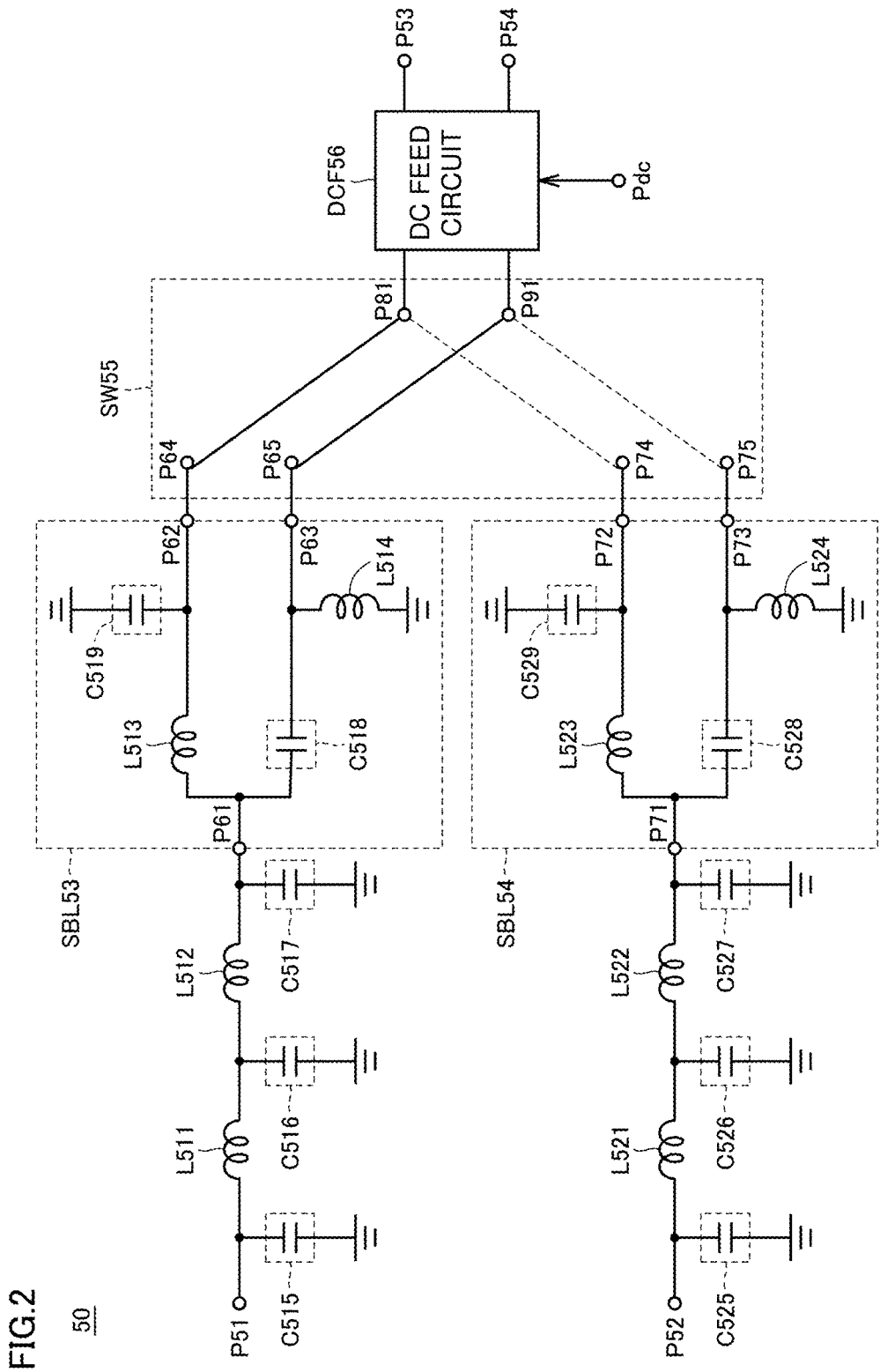
FIG. 2 is a circuit diagram of a balun according to Comparative Example.

FIG. 2 is a circuit diagram of a balun 50 according to Comparative Example. The balun 50 converts between balanced signals and unbalanced signals of frequency f1 and between balanced signals and unbalanced signals of frequency f2. As illustrated in FIG. 2, the balun 50 includes terminals P51 to P54, converters SBL53 and SBL54, a switch SW55, inductors L511, L512, L521, and L522, capacitors C515 to C517 and C525 to C527, and a DC feed circuit DCF56.

The terminals P51 and P52 for unbalanced signals. The terminals P51 and P52 are electrically connected to corresponding antennas (not illustrated). The terminal P51 receives input of unbalanced signals of frequency f1 and outputs unbalanced signals of frequency f1. The terminal P52 receives input of unbalanced signals of frequency f2 and outputs unbalanced signals of frequency f2.

The terminals P53 and P54 are for balanced signals. The terminals P53 and P54 are electrically connected to an IC (not illustrated). A signal output from the terminal P53 and a signal output from the terminal P54 have a phase difference of 180 degrees therebetween. A signal input to the terminal P53 and a signal input to the terminal P54 have a phase difference of 180 degrees therebetween.

The switch SW55 includes terminals P64, P65, P74, and P75 and terminals P81 and P91. The switch SW55 is preferably a 4-pole double-throw (4PDT) switch, for example. The switch SW55 switches between a connected state (denoted by solid lines) in which a connection between the terminals P64 and P81 and a connection between the terminals P65 and P91 are provided and a connected state (denoted by dotted lines) in which a connection between the terminals P74 and P81 and a connection between the terminals P75 and P91 are provided. When the balun 50 converts signals of frequency f1, the switch SW55 provides the connection between the terminals P64 and P81 and the connection between the terminals P65 and P91. When the balun 50 converts signals of frequency f2, the switch SW55 provides the connection between the terminals P74 and P81 and the connection between the terminals P75 and P91.

The converter SBL53 is electrically connected between the terminal P51 and the switch SW55. The converter SBL53 is a balun for signals of frequency f1. The converter SBL53 includes terminals P61 to P63, inductors L513 and L514, and capacitors C518 and C519. The terminal P61 is a terminal for unbalanced signals. Unbalanced signals from the terminal P51 are input to the terminal P61 and unbalanced signals from the terminal P61 are output from the terminal P51. The terminals P62 and P63 are terminals for balanced signals. The terminal P62 is electrically connected to the terminal P64. The terminal P63 is electrically connected to the terminal P65. The inductor L513 is electrically connected between the terminals P61 and P62. The capacitor C518 is electrically connected between the terminals P61 and P63. The capacitor C519 is electrically connected between the terminal P62 and the ground point. The inductor L514 is electrically connected between the terminal P63 and the ground point. In the converter SBL53, the inductor L513 and the capacitor C518 provide a signal with a 90-degree phase shift in one direction and another 90-degree phase shift in the opposite direction.

The converter SBL54 is electrically connected between the terminal P52 and the switch SW55. The converter SBL54 is a balun for signals of frequency f2. The converter SBL54 includes terminals P71 to P73, inductors L523 and L524, and capacitors C528 and C529. The terminal P71 is a terminal for unbalanced signals. Unbalanced signals from the terminal P52 are input to the terminal P71 and unbalanced signals from the terminal P71 are output from the terminal P52. The terminals P72 and P73 are terminals for balanced signals. The terminal P72 is electrically connected to the terminal P74. The terminal P73 is electrically connected to the terminal P75. The inductor L523 is electrically connected between the terminals P71 and P72. The capacitor C528 is electrically connected between the terminals P71 and P73. The capacitor C529 is electrically connected between the terminal P72 and the ground point. The inductor L524 is electrically connected between the terminal P73 and the ground point. In the converter SBL54, the inductor L523 and the capacitor C528 provide a signal with a 90-degree phase shift in one direction and another 90-degree phase shift in the opposite direction.

The inductors L511 and L512 are electrically connected in series between the terminal P51 and the converter SBL53. The capacitor C515 is electrically connected between the terminal P51 and the ground point. The capacitor C516 is electrically connected between the inductor L511 and the ground point. The capacitor C517 is electrically connected between the inductor L512 and the ground point.

The inductors L521 and L522 are electrically connected in series between the terminal P52 and the converter SBL54. The capacitor C525 is electrically connected between the terminal P52 and the ground point. The capacitor C526 is electrically connected between the inductor L521 and the ground point. The capacitor C527 is electrically connected between the inductor L522 and the ground point.

The DC feed circuit DCF56 is electrically connected between the terminals P53 and P81 and is electrically connected between the terminals P54 and P91. The DC feed circuit DCF56 adjusts the direct potentials of the terminals P53 and P54 according to the voltage applied from a DC feed terminal Pdc.

The converter SBL53, which is a balun for the frequency f1, includes two terminals for balanced signals, that is, the terminals P62 and P63 as opposed to one terminal for unbalanced signals, that is, the terminal P61. The converter SBL54, which is a balun for the frequency f2, includes two terminals for balanced signals, that is, the terminals P72 and P73 as opposed to one terminal for unbalanced signals, that is, the terminal P71. To convert between balanced signals and unbalanced signals of frequency f1 and between balanced signals and unbalanced signals of frequency f2, the balun 50 needs the 4PDT switch SW55 for switching between the state in which the two terminals for balanced signals of the converter SBL53 are electrically connected, respectively, to the terminals P53 and P54 and the state in which the two terminals for balanced signals of the converter SBL54 are connected respectively to the terminals P53 and P54. The balun 50 may be large in size due to the need to include the 4PDT switch SW55.

The first preferred embodiment thus includes, in place of the switch, LC parallel resonators of different resonant frequencies. With LC parallel resonators of different resonant frequencies, that is, two LC parallel resonators of the first resonant frequency that are magnetically coupled with each other and the other two LC parallel resonators of the second resonant frequency that are magnetically coupled with each other, the balun is able to convert between balanced signals and unbalanced signals of the first resonant frequency and between balanced signals and unbalanced signals of the second resonant frequency. The balun according to the first preferred embodiment eliminates the need to include a switch, and a multi-band balun may have a small size accordingly.

Referring back to FIG. 1, when the terminal P1 receives input of unbalanced signals of frequency f1, which is the resonant frequency of the LC parallel resonator PLC12, the impedance of the LC parallel resonator PLC12 accordingly becomes extremely high (approaches infinity) where the ground point is seen from the terminal P1 with the LC parallel resonator PLC12 therebetween. This hinders the unbalanced signals of frequency f1 that are input from the terminal P1 from passing through the LC parallel resonator PLC12 toward the ground point. Consequently, the magnetic coupling between the LC parallel resonators PLC12 and PLC13 is strengthened, and thus, most of the unbalanced signals of frequency f1 that are input from the terminal P1 are transmitted from the inductor L122 to the inductor L132 through the magnetic coupling.

Since the frequency f1 is also the resonant frequency of the LC parallel resonator PLC13, the impedance of the LC parallel resonator PLC13 accordingly becomes extremely high (approaches infinity) where the terminal P4 is seen from the terminal P3 with the LC parallel resonator PLC13 therebetween. This hinders signals output from the end portion of the inductor L132 on the terminal P3 side from passing through the LC parallel resonator PLC13 toward the terminal P4. Consequently, most of the signals output from the end portion of the inductor L132 on the terminal P3 side pass through the inductors L133 and L141 toward the terminal P3.

As in the above case, the impedance of the LC parallel resonator PLC13 accordingly becomes extremely high (approaches infinity) where the terminal P3 is seen from the terminal P4 with the LC parallel resonator PLC13 therebetween. This hinders signals output from the end portion of the inductor L132 on the terminal P4 side from passing through the LC parallel resonator PLC13 toward the terminal P3. Consequently, most of the signals output from the end portion of the inductor L132 on the terminal P4 side pass through the inductors L134 and L142 toward the terminal P4.

A signal output from one end portion of the inductor L132 and a signal output from the other end portion of the inductor L132 have a phase difference of 180 degrees therebetween. The inductance of the inductor L133 is equal or substantially equal to the inductance of the inductor L134. Similarly, the inductance of the inductor L141 is equal or substantially equal to the inductance of the inductor L142. The phase shift of a signal after passing through the inductor L133 is equal or substantially equal to the phase shift of the signal after passing through the inductor L134. Similarly, the phase shift of a signal after passing through the inductor L141 is equal or substantially equal to the phase shift of the signal after passing through the inductor L142. Thus, the phase difference between a signal that travels from the end portion of the inductor L132 on the terminal P3 side through the inductors L133 and L141 and is output from the terminal P3 and a signal that travels from the end portion of the inductor L132 on the terminal P4 side through the inductors L134 and L142 and is output from the terminal P4 remains at 180 degrees. This means that balanced signals of frequency f1 are output from the terminal P3 and P4.

When the terminal P2 receives input of unbalanced signals of frequency f1, which is not the resonant frequency of the LC parallel resonator PLC22, the impedance of the LC parallel resonator PLC22 accordingly does not reach an extremely high value where the ground point is seen from the terminal P2 with the LC parallel resonator PLC22 therebetween. Thus, most of the signals of frequency f1 that are input from the terminal P2 pass through the LC parallel resonator PLC22 toward the ground point. Consequently, the magnetic coupling between the LC parallel resonators PLC22 and PLC23 is weakened, and thus most of the unbalanced signals of frequency f1 that are input from the terminal P2 are not transmitted from the LC parallel resonator PLC22 to the LC parallel resonator PLC23. As a result, most of the unbalanced signals of frequency f1 that are input to the terminal P2 are not transmitted to the terminals P3 and P4.

When the terminal P2 receives input of unbalanced signals of frequency f2, these signals are then output as balanced signals from the terminals P3 and P4. When the terminal P1 receives input of unbalanced signals of frequency f2, most of these signals are not transmitted to the terminals P3 and P4.

When the terminals P3 and P4 receive input of balanced signals of frequency f1, which is the resonant frequency of each of the LC parallel resonators PLC12 and PLC13, the magnetic coupling between the LC parallel resonators PLC12 and PLC13 is strengthened accordingly. Consequently, the balanced signals of frequency f1 are transmitted from the LC parallel resonator PLC13 to the LC parallel resonator PLC12 through the magnetic coupling and then output as unbalanced signals of frequency f1 from the terminal P1.

Since the frequency f1 is not the resonant frequency of each of the LC parallel resonators PLC22 and PLC23, the magnetic coupling between the LC parallel resonators PLC22 and PLC23 is weakened. Consequently, most of the balanced signals of frequency f1 that are input from the terminals P3 and P4 are not transmitted from the LC parallel resonator PLC23 to the LC parallel resonator PLC22.

When the terminals P3 and P4 receive input of balanced signals of frequency f2, which is the resonant frequency of each of the LC parallel resonators PLC22 and PLC23, the magnetic coupling between the LC parallel resonators PLC22 and PLC23 is strengthened accordingly. Consequently, the balanced signals of frequency f2 are transmitted from the LC parallel resonator PLC23 to the LC parallel resonator PLC22 through the magnetic coupling and then output as unbalanced signals of frequency f2 from the terminal P2.

Since the frequency f2 is not the resonant frequency of each of the LC parallel resonators PLC12 and PLC13, the magnetic coupling between the LC parallel resonators PLC12 and PLC13 is weakened. Consequently, most of the balanced signals of frequency f2 that are input from the terminals P3 and P4 are not transmitted from the LC parallel resonator PLC13 to the LC parallel resonator PLC12.

The balun 10 is able to therefore convert between balanced signals and unbalanced signals of frequency f1 and convert between balanced signals and unbalanced signals of frequency f2.

First Modification of First Preferred Embodiment

Figure 3:
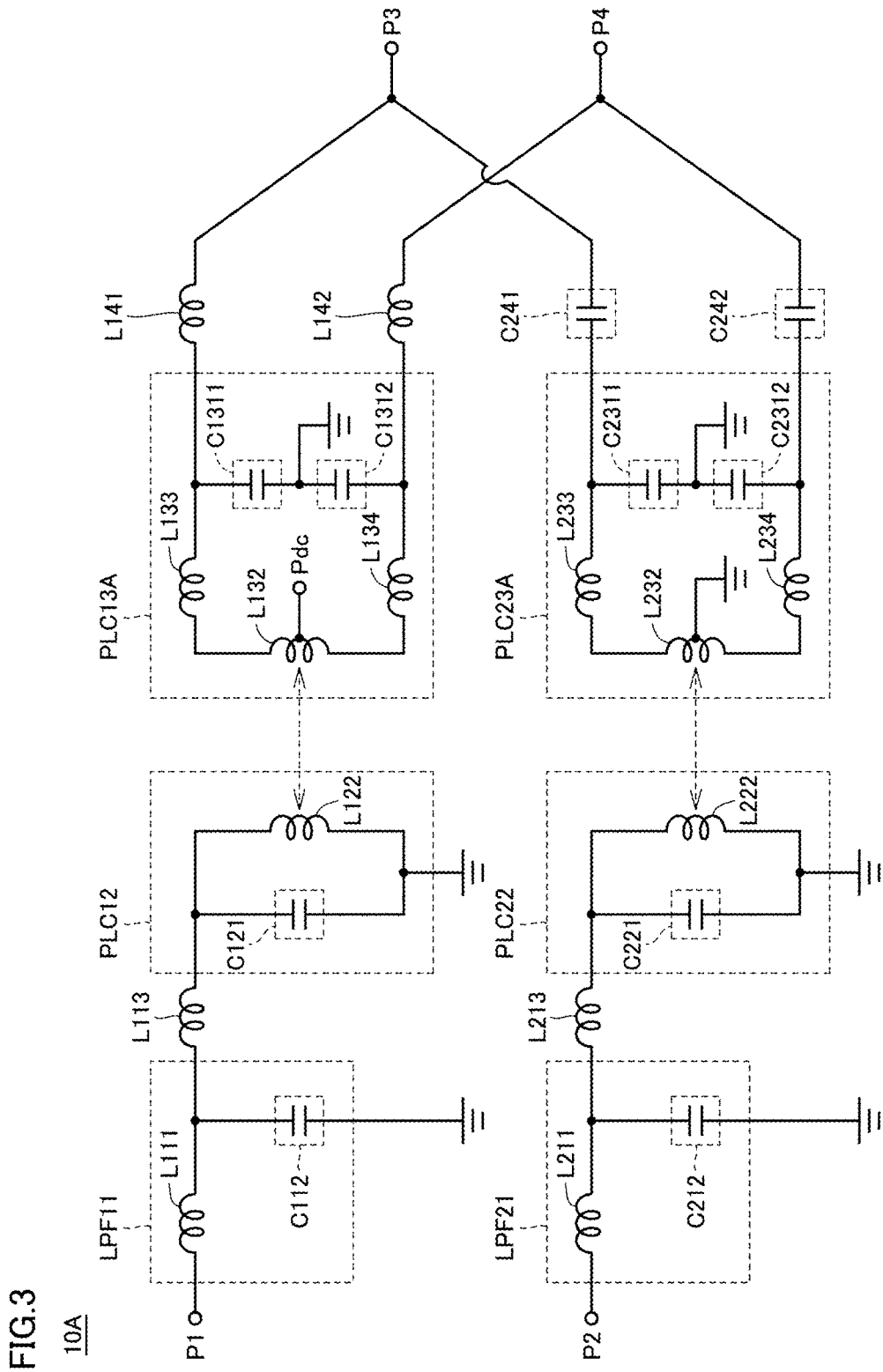
FIG. 3 is a circuit diagram of a balun according to a first modification of the first preferred embodiment of the present invention.

FIG. 3 is a circuit diagram of a balun 10A according to a first modification of the first preferred embodiment. For the balun 10A, the capacitor C131 of the LC parallel resonator PLC13 illustrated in FIG. 1 is replaced with capacitors C1311 and C1312 of an LC parallel resonator PLC13A illustrated in FIG. 3. The capacitors C1311 and C1312 are electrically connected in series. Although the node between the capacitors C1311 and C1312 is grounded in FIG. 3, it is not always required that the node between the capacitors C1311 and C1312 be grounded. Furthermore, the capacitor C231 of the LC parallel resonator PLC23 illustrated in FIG. 1 is replaced with capacitors C2311 and C2312 of an LC parallel resonator PLC23A illustrated in FIG. 3. The capacitors C2311 and C2312 are electrically connected in series. Although the node between the capacitors C2311 and C2312 is grounded, it is not always required that the node between the capacitors C2311 and C2312 be grounded.

The balun according to preferred embodiments of the present invention may include a multilayer body including a plurality of dielectric layers stacked on top of each other. Configuring the balun to include a plurality of dielectric layers provides flexible design of overlaps among capacitor conductor patterns that define the capacitors. Even if there is not enough space left to define one capacitor such as the capacitor C131 (C231) of the balun 10 illustrated in FIG. 1, a plurality of capacitors such as the capacitors C1311 and C1312 (C2311 and C2312) of the balun 10A illustrated in FIG. 3 may be provided in segmented spaces to provide a preferable amount of capacitance. Furthermore, the range of variation in characteristics of capacitors may be narrower in a configuration in which a plurality of capacitors, that is, the capacitors C1311 and C1312 (C2311 and C2312) are provided than in a configuration in which one capacitor, that is, the capacitor C131 (C231) is provided.

Configuring the balun according to the first preferred embodiment as a multilayer body including a plurality of dielectric layers stacked on top of each other provides efficient use of the mounting space. Thus, the first preferred embodiment is able to provide a multi-band balun that is smaller in size than would be possible if the balun according to the first preferred embodiment were provided as a discrete circuit.

Second Modification of First Preferred Embodiment

Figure 4:
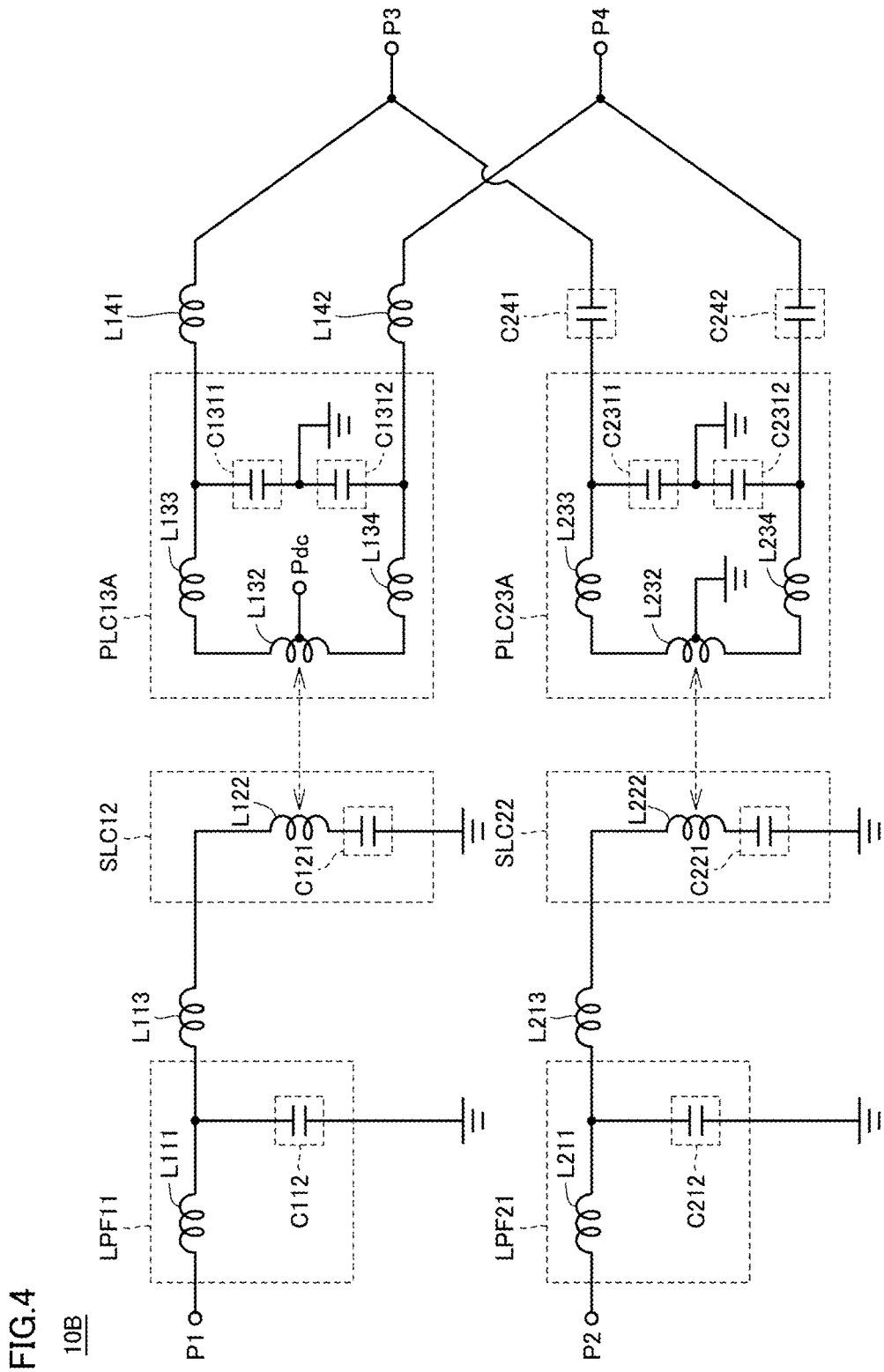
FIG. 4 is a circuit diagram of a balun according to a second modification of the first preferred embodiment of the present invention.

The first preferred embodiment, in which LC parallel resonators are included as LC resonators in the balun, has been described so far. Alternatively, LC series resonators may be included as in a balun 10B illustrated in FIG. 4 according to a second modification of the first preferred embodiment. In the balun 10B illustrated in FIG. 4, the LC parallel resonators PLC12 and PLC22 illustrated in FIG. 3 are replaced with LC series resonators SLC12 and SLC22, respectively. The balun 10B is otherwise the same as or similar to the balun 10A and a redundant description thereof will be omitted.

The LC series resonator SLC12 is electrically connected between the terminal P1 and the ground point. The resonant frequency of the LC series resonator SLC12 is the frequency f1. In the LC series resonator SLC12, the capacitor C121 and the inductor L122 are electrically connected in series between the terminal P1 and the ground point.

The LC series resonator SLC22 is electrically connected between the terminal P2 and the ground point. The resonant frequency of the LC series resonator SLC22 is the frequency f2. In the LC series resonator SLC22, the capacitor C221 and the inductor L222 are electrically connected in series between the terminal P2 and the ground point.

Each of the baluns according to the first preferred embodiment, the first modification of the first preferred embodiment, and the second modification of the first preferred embodiment eliminates the need to include a switch in a multi-band balun. Accordingly, the multi-band balun is able to have a small size.

Second Preferred Embodiment

In the first preferred embodiment, a dual-band balun has been described. The second preferred embodiment of the present invention will be described as a balun for three or more bands.

Figure 5:
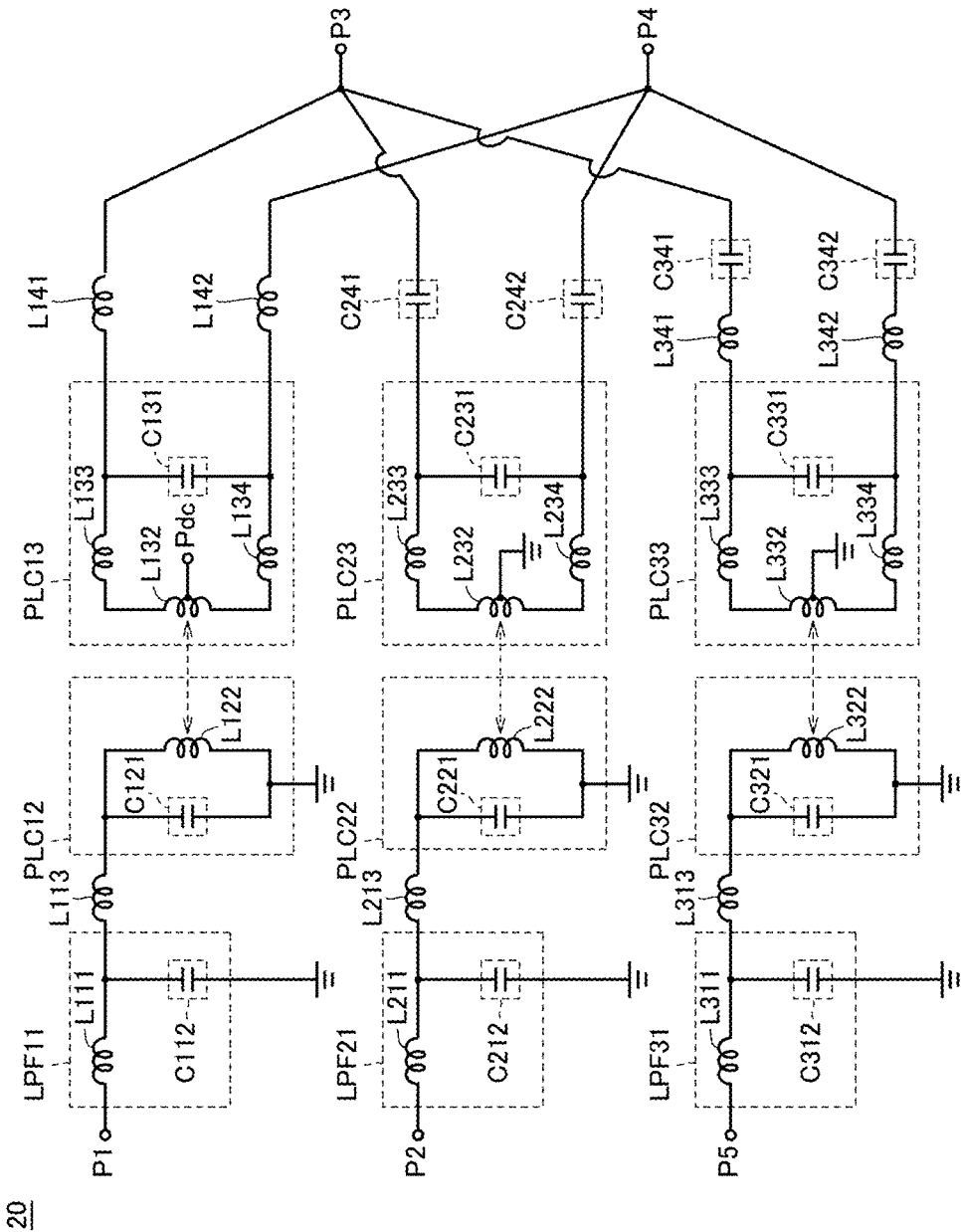
FIG. 5 is a circuit diagram of a balun according to Preferred Embodiment 2 of the present invention.

FIG. 5 is a circuit diagram of a balun 20 according to the second preferred embodiment. The balun 20 is provided by adding, to the balun 10 illustrated in FIG. 1, a terminal P5, a low-pass filter LPF31, LC parallel resonators PLC32 and PLC33, inductors L313, L341, and L342, and capacitors C341 and C342. The balun 20 is otherwise the same as or similar to the balun 10 illustrated in FIG. 1 and a redundant description thereof will be omitted.

The balun 20 converts between balanced signals and unbalanced signals of frequency f1, between balanced signals and unbalanced signals of frequency f2 (f2>f1), and between balanced signals and unbalanced signals of frequency f3 (f2>f3>f1).

The terminal P5 is a terminal for unbalanced signals. The terminal P5 is electrically connected to an antenna (not illustrated). The terminal P5 receives input of unbalanced signals of frequency f3 and outputs unbalanced signals of frequency f3.

The LC parallel resonator PLC32 is electrically connected between the terminal P5 and the ground point. The resonant frequency of the LC parallel resonator PLC32 is the frequency f3. The LC parallel resonator PLC32 includes a capacitor C321 and an inductor L322. The capacitor C321 and the inductor L322 are electrically connected in parallel between the terminal P5 and the ground point.

The LC parallel resonator PLC33 is electrically connected between the terminals P3 and P4. The resonant frequency of the LC parallel resonator PLC33 is the frequency f3. The LC parallel resonator PLC33 includes a capacitor C331 and inductors L332 to L334. The capacitor C331 and the inductor L332 are electrically connected in parallel between the terminals P3 and P4. The inductor L332 is magnetically coupled with the inductor L322.

The inductor L333 is electrically connected between one end of the capacitor C331 and one end of the inductor L332. The inductor L334 is electrically connected between the other end of the capacitor C331 and the other end of the inductor L332. The inductance of the inductor L333 is equal or substantially equal to the inductance of the inductor L334. The inductors L333 and L334 are provided to set the impedance of the LC parallel resonator PLC33 to a preferable or predetermined value. The inductors L332 to L334 may be defined by one inductor.

The inductor L313 is electrically connected between the terminal P5 and the LC parallel resonator PLC32. Together with the capacitor C321 included in the LC parallel resonator PLC32, the inductor L313 defines a low-pass filter. The low-pass filter allows signals of frequency f3 to pass therethrough and significantly reduces the harmonic waves of signals of frequency f3. The source of the harmonic waves of signals of frequency f3 is, for example, an IC (not illustrated) to which the terminals P3 and P4 are electrically connected or an external device (not illustrated) electrically connected to the terminal P5.

The low-pass filter LPF31 is electrically connected between the terminal P5 and the inductor L313. The low-pass filter LPF31 includes an inductor L311 and a capacitor C312. The inductor L311 is electrically connected between the terminal P5 and the inductor L313. The capacitor C312 is electrically connected between the inductor L311 and the ground point. The low-pass filter LPF31 allows signals of frequency f3 to pass therethrough and significantly reduces the harmonic waves of signals of frequency f3.

The capacitor C341 and the inductor L341 are electrically connected in series between the terminal P3 and the LC parallel resonator PLC33. The capacitor C341 and the inductor L341 electrically connected in series allow signals of frequency f3 to pass therethrough and significantly reduce signals of frequencies higher than the frequency f3 (e.g., signals of frequency f2) and signals of frequencies lower than the frequency f3 (e.g., signals of frequency f1). In place of the capacitor C341 and the inductor L341 electrically connected in series, a band-pass filter may be included.

The capacitor C342 and the inductor L342 are electrically connected in series between the terminal P4 and the LC parallel resonator PLC33. The capacitor C342 and the inductor L342 electrically connected in series allow signals of frequency f3 to pass therethrough and significantly reduce signals of frequencies higher than the frequency f3 (e.g., signals of frequency f2) and signals of frequencies lower than the frequency f3 (e.g., signals of frequency f1). In place of the capacitor C342 and the inductor L342 electrically connected in series, a band-pass filter may be included.

The inductance of the inductor L342 is equal or substantially equal to the inductance of the inductor L341. The capacitance of the capacitor C342 is equal or substantially equal to the capacitance of the capacitor C341.

The balun according to the second preferred embodiment is not limited to the triple-band balun described above and may further include, for example, additional terminals, band-pass filters, PLCs, inductors, and capacitors to provide a balun for four or more bands. The inductor L332 may be connected, for example, with a DC feed terminal.

The balun according to the second preferred embodiment eliminates the need to include a switch in a multi-band balun. Accordingly, the multi-band balun is able to have a small size.

The preferred embodiments disclosed herein are conceivably used in combination as appropriate, to the extent not inconsistent with the present disclosure. It should be understood that the preferred embodiments disclosed herein are in all aspects illustrative and not restrictive. The scope of the present invention is defined by the claims rather than by the above description, and all changes that fall within metes and bounds of the claims, or equivalence of such metes and bounds thereof, are therefore intended to be embraced by the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balun comprising:
   a first terminal and a second terminal for unbalanced signals;
   a third terminal and a fourth terminal for balanced signals;
   a first LC resonator electrically connected between the first terminal and a ground point;
   a second LC resonator magnetically coupled with the first LC resonator and electrically connected between the third terminal and the fourth terminal;
   a third LC resonator electrically connected between the second terminal and the ground point;
   a fourth LC resonator magnetically coupled with the third LC resonator and electrically connected between the third terminal and the fourth terminal in parallel with the second LC resonator;
   a first inductor electrically connected between the third terminal and the second LC resonator;
   a second inductor electrically connected between the fourth terminal and the second LC resonator;
   a first capacitor electrically connected between the third terminal and the fourth LC resonator; and
   a second capacitor electrically connected between the fourth terminal and the fourth LC resonator, wherein
   each of the first LC resonator and the second LC resonator has a resonant frequency that is a first resonant frequency; and
   each of the third LC resonator and the fourth LC resonator has a resonant frequency that is a second resonant frequency higher than the first resonant frequency.

2. The balun according to claim 1, wherein
   the first LC resonator includes a third capacitor and a third inductor electrically connected in parallel;
   the second LC resonator includes a fourth capacitor and a fourth inductor electrically connected in parallel;
   the fourth inductor is magnetically coupled with the third inductor;
   the third LC resonator includes a fifth capacitor and a fifth inductor electrically connected in parallel;
   the fourth LC resonator includes a sixth capacitor and a sixth inductor electrically connected in parallel; and
   the sixth inductor is magnetically coupled with the fifth inductor.

3. The balun according to claim 1, wherein
   the first LC resonator includes a third capacitor and a third inductor electrically connected in series;
   the second LC resonator includes a fourth capacitor and a fourth inductor electrically connected in parallel;
   the fourth inductor is magnetically coupled with the third inductor;
   the third LC resonator includes a fifth capacitor and a fifth inductor electrically connected in series;
   the fourth LC resonator includes a sixth capacitor and a sixth inductor electrically connected in parallel; and
   the sixth inductor is magnetically coupled with the fifth inductor.

4. The balun according to claim 2, further comprising a DC feed terminal electrically connected to the fourth inductor.

5. The balun according to claim 1, further comprising:
   a seventh inductor electrically connected between the first terminal and the first LC resonator; and
   an eighth inductor electrically connected between the second terminal and the third LC resonator.

6. The balun according to claim 5, further comprising:
   a first low-pass filter electrically connected between the first terminal and the seventh inductor; and
   a second low-pass filter electrically connected between the second terminal and the eighth inductor.

7. The balun according to claim 6, wherein
   the first low-pass filter includes:
      a ninth inductor electrically connected between the first terminal and the seventh inductor; and a seventh capacitor electrically connected between the ninth inductor and the ground point; and the second low-pass filter includes:
a tenth inductor electrically connected between the second terminal and the eighth inductor; and
an eighth capacitor electrically connected between the tenth inductor and the ground point.

8. The balun according to claim 1, wherein
an inductance of the first inductor is equal or substantially equal to an inductance of the second inductor, and
a capacitance of the first capacitor is equal or substantially equal to a capacitance of the second capacitor.

9. The balun according to claim 1, further comprising:
a fifth terminal for unbalanced signals;
a fifth LC resonator electrically connected between the fifth terminal and the ground point;
a sixth LC resonator magnetically coupled with the fifth LC resonator and electrically connected between the third terminal and the fourth terminal;
an eleventh inductor and a ninth capacitor electrically connected in series between the third terminal and the sixth LC resonator; and
a twelfth inductor and a tenth capacitor electrically connected in series between the fourth terminal and the sixth LC resonator; wherein
each of the fifth LC resonator and the sixth LC resonator has a resonant frequency that is a third resonant frequency higher than the first resonant frequency and lower than the second resonant frequency.

10. The balun according to claim 9, wherein
an inductance of the eleventh inductor is equal or substantially equal to an inductance of the twelfth inductor; and
a capacitance of the ninth capacitor is equal or substantially equal to a capacitance of the tenth capacitor.

11. The balun according to claim 1, wherein the balun includes a multilayer body including a plurality of dielectric layers.

12. The balun according to claim 6, wherein
the first low-pass filter allows signals of the first resonant frequency to pass therethrough and filters harmonic waves of the first resonant frequency; and
the second low-pass filter allows signals of the second resonant frequency to pass therethrough and filters harmonic waves of the second resonant frequency.

13. The balun according to claim 1, wherein at least one of the first capacitor and the second capacitor is included in a high-pass filter.

14. The balun according to claim 1, wherein
the first terminal is electrically connected to a first antenna; and
the second terminal is electrically connected to a second antenna.

15. The balun according to claim 14, wherein the first antenna outputs harmonic waves of signals of the first resonant frequency, or the second antenna outputs harmonic waves of signals of the second resonant frequency.

16. The balun according to claim 1, wherein the third terminal and the fourth terminal are electrically connected to an integrated circuit.

17. The balun according to claim 16, wherein the integrated circuit outputs harmonic waves of signals of at least one of the first resonant frequency or the second resonant frequency.

\* \* \* \* \*